United States Patent
Chien et al.

(10) Patent No.: US 6,509,216 B2
(45) Date of Patent: Jan. 21, 2003

(54) MEMORY STRUCTURE WITH THIN FILM TRANSISTOR AND METHOD FOR FABRICATING THE SAME

(75) Inventors: Sun-Chieh Chien, Hsinchu (TW); Chien-Li Kuo, Hsinchu (TW)

(73) Assignee: United Microelectronics Corp., Hsinchu (TW)

( * ) Notice: Subject to any disclaimer, the term of this patent is extended or adjusted under 35 U.S.C. 154(b) by 37 days.

(21) Appl. No.: 09/801,253

(22) Filed: Mar. 7, 2001

(65) Prior Publication Data

US 2002/0137275 A1 Sep. 26, 2002

(51) Int. Cl.[7] ...................... H01L 21/339; H01L 21/00; H01L 21/84
(52) U.S. Cl. ...................... 438/152; 438/153
(58) Field of Search .................. 438/152, 153, 438/FOR 200, FOR 212, FOR 220

(56) References Cited

U.S. PATENT DOCUMENTS

| | | | |
|---|---|---|---|
| 5,470,776 A | * 11/1995 | Ryou | 438/152 |
| 5,898,189 A | * 4/1999 | Gardner et al. | 257/350 |
| 6,204,099 B1 | * 3/2001 | Kusumoto et al. | 438/151 |
| 6,294,424 B1 | * 9/2001 | Kang et al. | 438/152 |

FOREIGN PATENT DOCUMENTS

| JP | 05183133 A | * 7/1993 |
|---|---|---|
| JP | 05183134 A | * 7/1993 |

* cited by examiner

Primary Examiner—George Fourson
Assistant Examiner—Michelle Estrada
(74) Attorney, Agent, or Firm—J.C. Patents

(57) ABSTRACT

A structure of memory device with thin film transistor is proposed. The structure of the memory device includes a substrate. The substrate has shallow trench isolation structures, a thin film transistor, a memory cell transistor, a memory peripheral transistor, and logic circuit transistor. The shallow trench isolation structures are located in the memory cell region, the logic circuit region, and also on the memory peripheral region to isolate the memory peripheral region from the memory cell region and the logic circuit region. The thin film transistor with a thin film substrate is located above the shallow trench isolation structure at the logic circuit region. A method for fabricating the memory device with thin film transistor is also proposed, where a thin film conductive layer is formed over the substrate at the logic circuit region to serve as the thin film transistor substrate.

9 Claims, 8 Drawing Sheets

MEMORY STRUCTURE WITH THIN FILM TRANSISTOR AND METHOD FOR FABRICATING THE SAME

BACKGROUND OF THE INVENTION

1. Field of Invention

The present invention relates to semiconductor fabrication. More particularly, the present invention relates to a memory structure embedded with a thin film transistor and a method for fabricating the memory structure.

2. Description of Related Art

As integration of an integrated circuit continuously increases, the area occupied by a device is accordingly reduced. One memory cell of a dynamic random access memory (DRAM) device typically includes a transistor and a capacitor. Therefore, when the integration increases, fabrication cost can be greatly reduced. In addition, since the DRAM has good capabilities for read and write, DRAM device has been one memory device having been widely used.

An embedded DRAM, which is one type of various DRAM devices, has a memory cell array and a logic circuit array formed at the peripheral area to the memory cell array. The memory cell array and the logic circuit array are integrated together into one DEAM chip, resulting in fast data access speed. This allows the DRAM device can be used in a system, which needs a great amount of data access with fast speed, such as an image processing system.

A trend in fabrication technology is toward to larger chip area and narrower line width, so as to have higher integration and have greater capabilities in the same device size. The fabrication can also be reduced. However, the chip area and the line width usually limits the increase of integration. It is difficult to further increase the device integration when the integration has reached to some high degree. How to increase the integration is now an issue in fabrication for developing.

SUMMARY OF THE INVENTION

The invention provides a memory device with a thin film transistor, which can be formed on a substrate without using additional mask.

The invention provides a memory device with a thin film transistor, which is formed on a shallow trench isolation structure, whereby the available chip area can be effective used, and the integration is effectively increased under the same size of the chip area.

As embodied and broadly described herein, the invention provides a method for fabricating a memory device with thin film transistor. The method includes providing a substrate which has shallow trench isolation (STI) structures in the substrate at a memory array region and a logic circuit region, where the memory array region includes a memory cell region and a memory peripheral region that is peripheral to the memory cell region. The memory peripheral region is also separated by the STI structures. A first dielectric layer and a thin film conductive layer are sequentially formed over the substrate. The thin film conductive layer at the logic region is doped. Also and, the threshold voltage adjustment is performed on the thin film conductive layer at the logic region. A second dielectric layer is formed over the substrate at the logic region. The thin film conductive layer at the memory region is doped, so as to reduce resistance of the thin film conductive layer thereon. A conductive layer and a cap layer are sequentially formed over he substrate. The substrate is patterned by photolithography and etching processes, whereby a gate structure at the memory cell region, a gate structure at the memory peripheral region, and a gate structure above the STI structure at the logic circuit region. The portion of the thin film conductive layer covered by the second dielectric layer still remains. A source/drain region is formed in the substrate at each side of the gate structure at the memory cell region. Then, a source/drain region is formed in the the memory peripheral region of the substrate at each side of the gate structure, and simultaneously a source/drain region is formed in the thin film conductive layer at each side of the gate structure above STI structure at the logic circuit region. The layers, including the first dielectric layer and the thin film conductive layer, over the substrate at the logic circuit region are patterned by photolithography and etching processes to form a gate structure at the logic circuit region. A source/drain region is formed in the substrate at each side of the gate structure at the logic circuit region. A metal salicide layer is formed on the gate structure and the source/drain region at the logic circuit region. A capacitor is formed at the memory region with contact on the source/drain region with respect to the each gate structure.

The invention also provides a structure of a memory device with thin film transistor. The structure of the memory device includes a substrate. The substrate has shallow trench isolation structures, a thin film transistor, a memory cell transistor, a memory peripheral transistor, and logic circuit transistor. The shallow trench isolation structures are located in the memory cell region, the logic circuit region, and also on the memory peripheral region to isolate the memory peripheral region from the memory cell region and the logic circuit region. The thin film transistor with a thin film substrate is located above at least one of the shallow trench isolation structures.

In the foregoing of the invention, the feature is that a thin film transistor is additionally formed above the shallow trench isolation structure at the logic circuit region. The available substrate area can be more efficiently utilized, and therefore the more transistors can be formed with the same substrate area. The device integration is then effectively increased.

Moreover, the formation of the thin film transistor is compatible with the current fabrication process for the embedded DRAM. There is no need of an extra step with additional photomask in the invention.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

In order to increase the degree of utilization on the available substrate area, the invention particularly formed an additional thin film transistor above a shallow trench isolation structure at the logic circuit region.

Figure 1A:
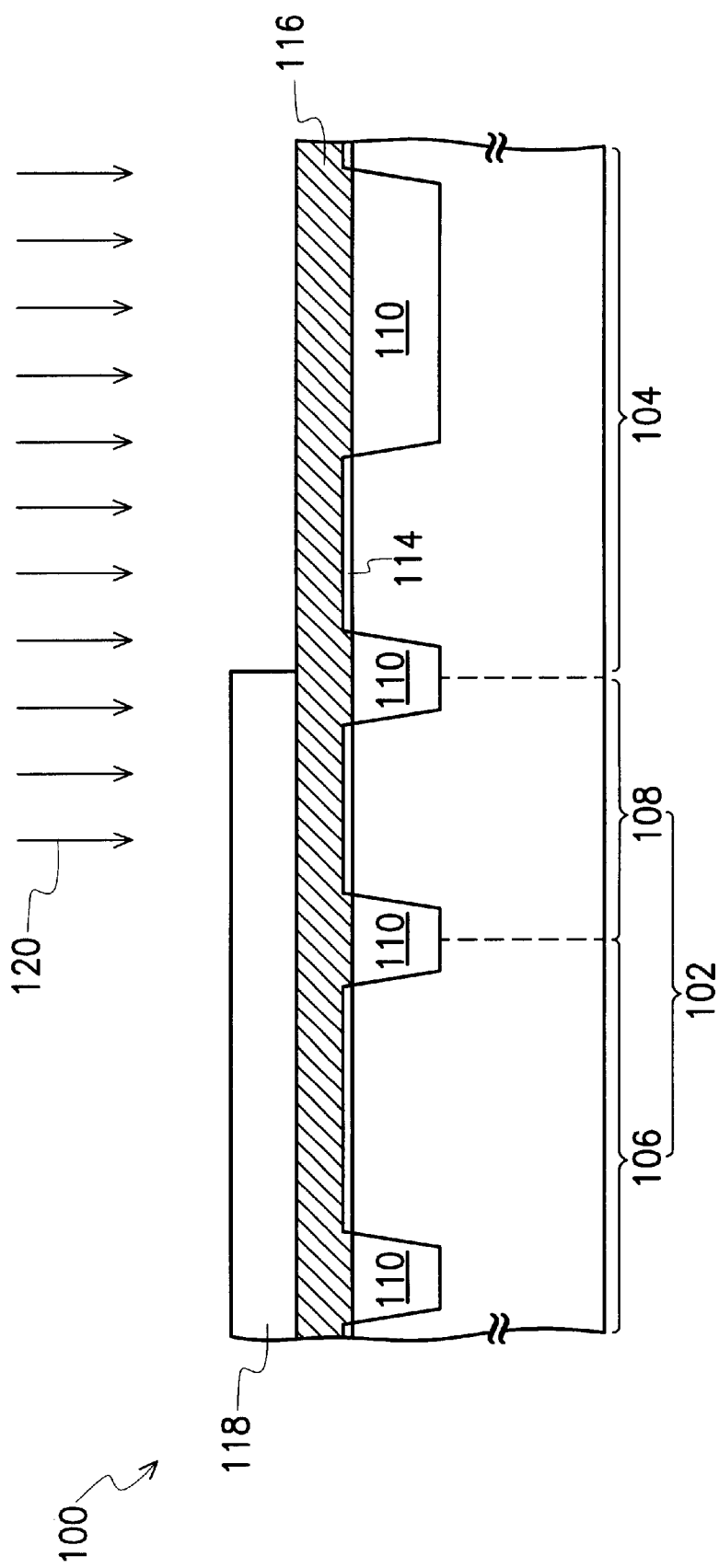
FIGS. 1A–1H are cross-sectional view, schematically illustrating the fabrication process for a memory device with a thin film transistor, according to one preferred embodiment of this invention.

An embodiment is provided for descriptions of the features of the invention. FIGS. 1A–1H are cross-sectional view, schematically illustrating the fabrication process for a memory device with a thin film transistor, according to one preferred embodiment of this invention. In FIG. 1A, a substrate 100 includes a memory array region 102 and a logic circuit region 104 which are isolated by shallow trench isolation (STI) structures 110. Some of the STI structure 110 are also formed in the memory array region 102 and the logic circuit regions. The memory array region 102 is also divided by the STI structure 110 into a memory cell region 106 and a memory peripheral region 108. A dielectric layer 114 is formed on the substrate 100 by, for example, an thermal oxidation process. A conductive layer 116 is formed over the substrate 100. The conductive layer 116 includes, for example, undoped polysilicon that is formed by, for example, chemical vapor deposition (CVD). The conductive layer 116 serves as a thin film conductive layer for a substrate for the thin film transistor for later. A photoresist layer 118 is formed on the conductive layer 116 to cover the memory cell region 102. An implantation process 120 is performed, using the photoresist layer 118 as a mask, to dope the conductive layer 116 at the logic circuit region 104. Also and, the threshold voltage adjustment in the conductive layer above STI structure 110 at the logic circuit region 104 is performed. Since the thin film transistor is to be formed above the STI structure 110, the conductive layer serves as the substrate of the thin film transistor. In general, the thin film transistor can be formed above any STI structure as intended according to design.

Figure 1B:
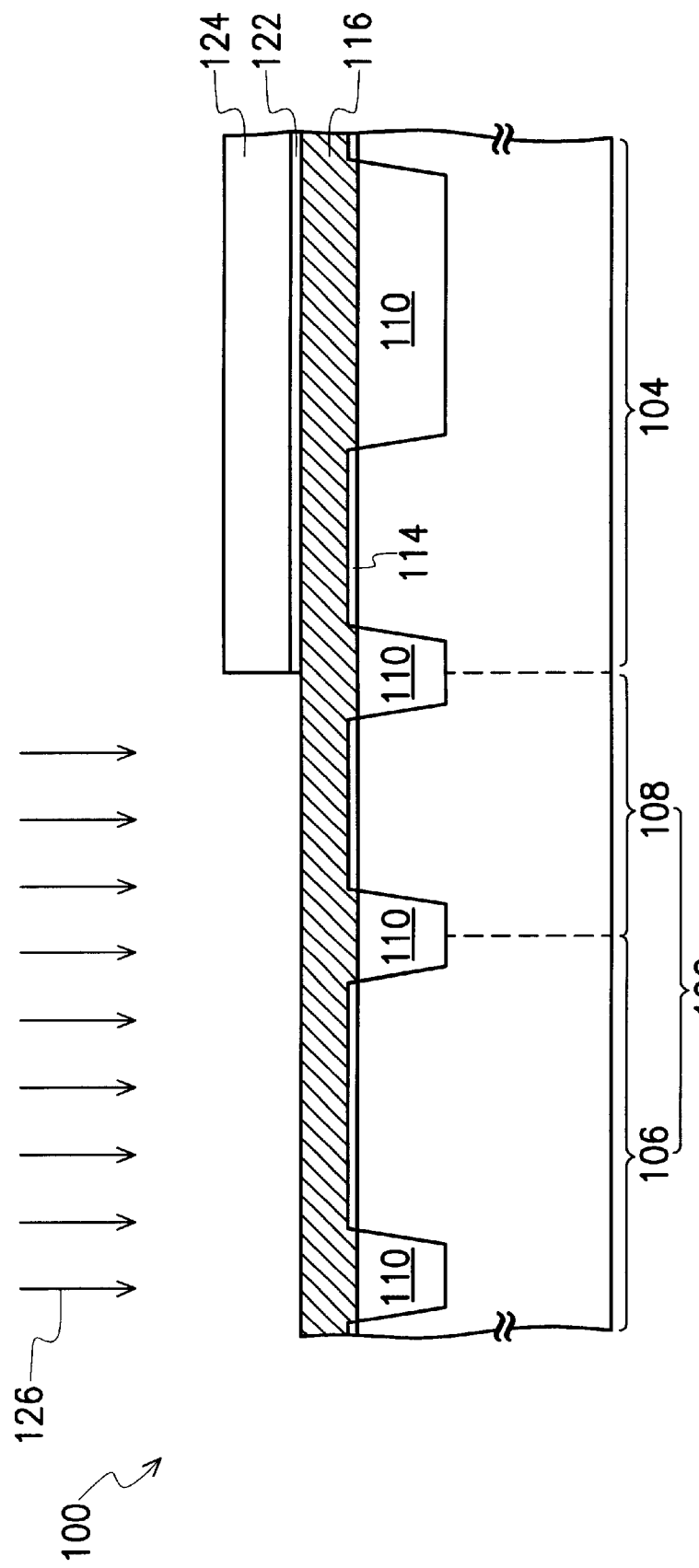

FIG. 1B, a dielectric layer 122 and a photoresist layer 124 are sequentially formed over the logic region 104 and a periphery formed on conductive layer 116 at the logic circuit region 104. The dielectric layer 122 includes, for example, silicon oxide, oxide/nitride/oxide or the dielectric layer with high dielectric constant about higher than oxide. The dielectric layer 122 includes silicon oxide or oxide/nitride/oxide, and can be formed by first depositing a preliminary oxide layer over the substrate 100, and patterning the preliminary dielectric layer to remove a portion of the dielectric layer at the memory array region 102. The remaining portion of the preliminary dielectric layer is the dielectric layer 122. Using the photoresist layer 124 as a mask, an implantation process 126 is performed to dope the conductive layer 116 at the memory array region 104, so as to reduce the resistance.

Figure 1C:
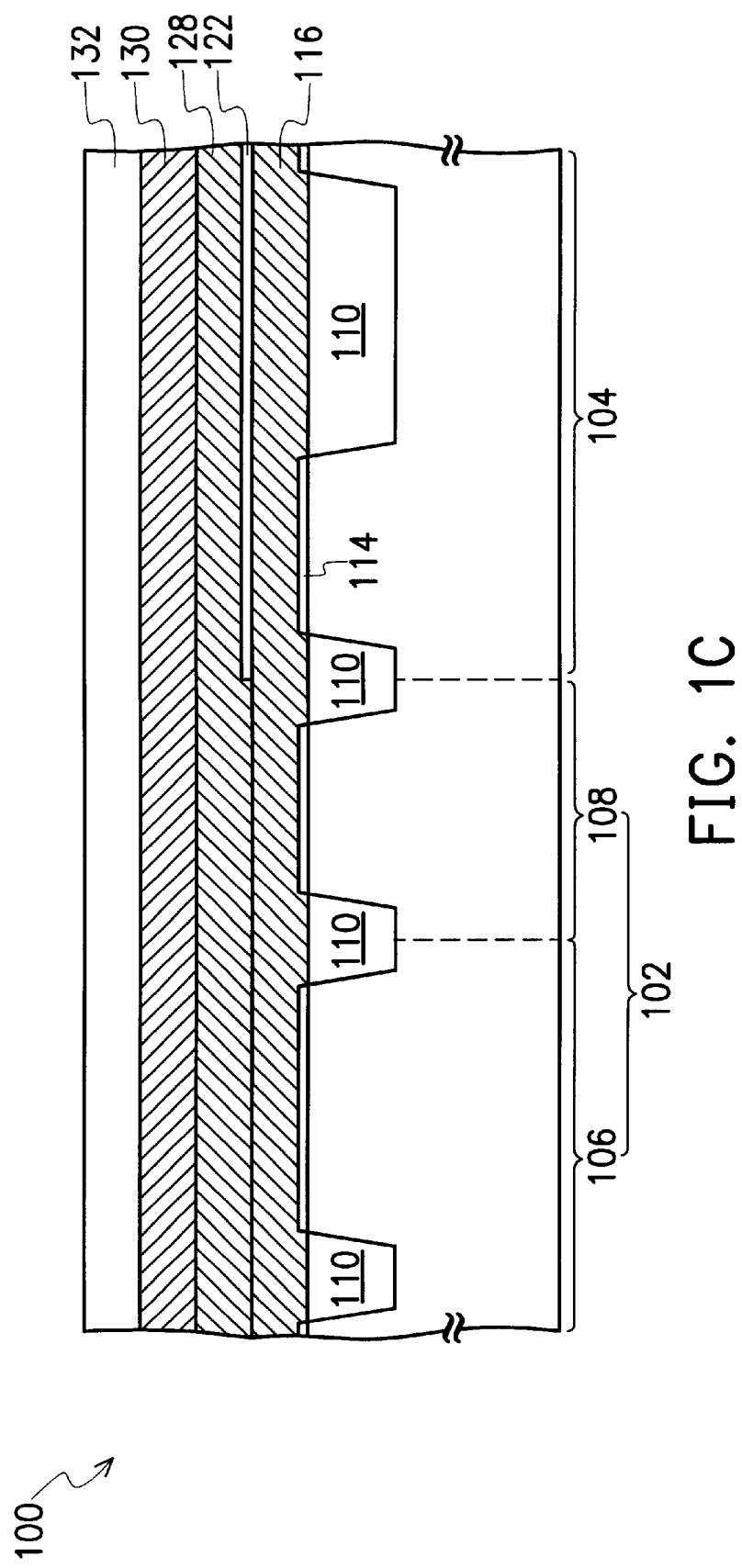

In FIG. 1C, the photoresist layer 124 is removed. A stacked conductive layer, such as the conductive layers 128, 130, and a cap layer 132 are sequentially formed over the substrate 100. The conductive layer 128 includes, for example, polysilicon. The conductive layer 130 includes, for example, metal silicide. The cap layer 132 includes, for example, silicon oxynitride, silicon nitride, or a composite layer of silicon nitride and silicon oxide, such as a oxide/nitride/oxide layer. The formation of the cap layer 132 includes, for example, chemical vapor deposition. The cap layer 132 relative to the conductive layers 128 and 130 has a different etching rate.

Figure 1D:
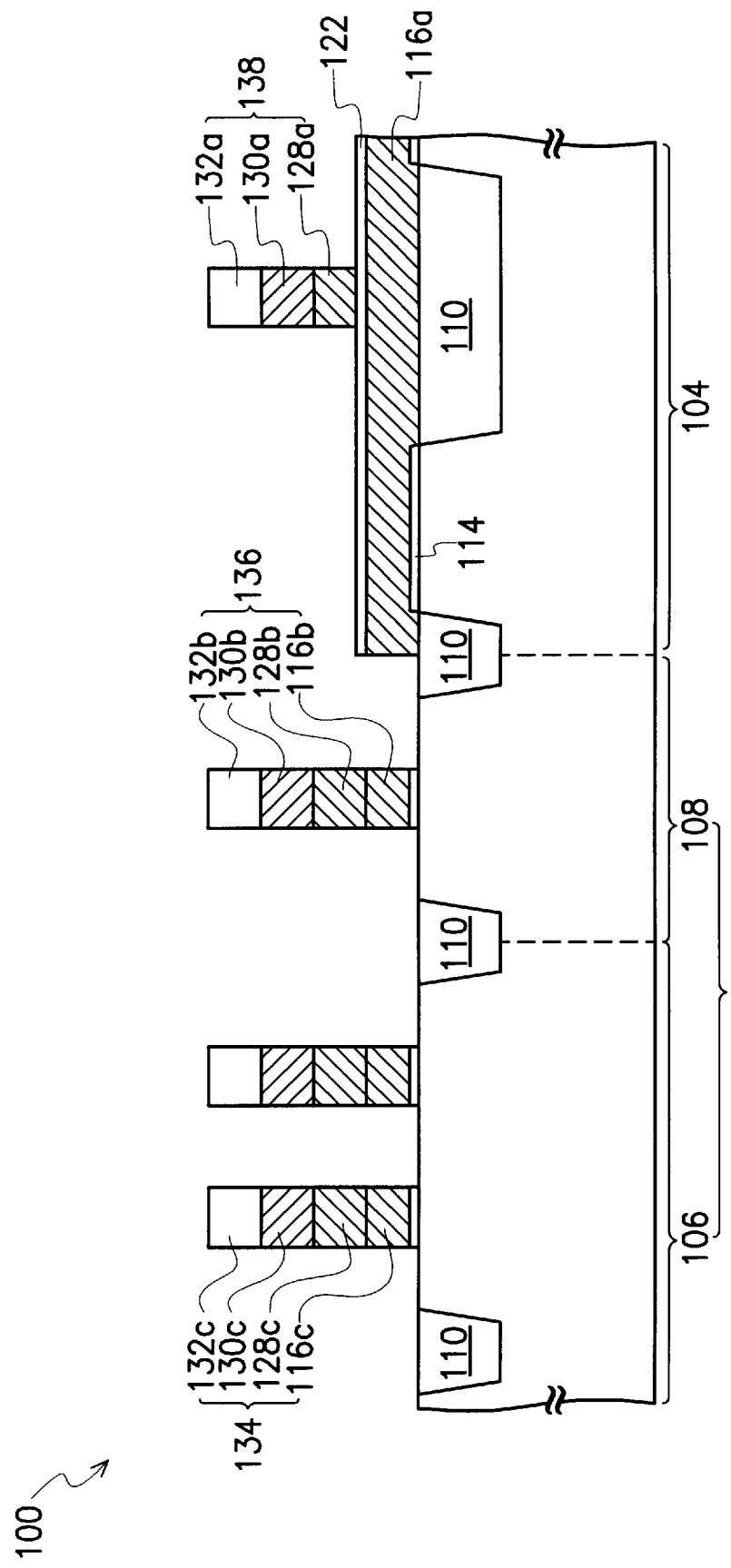

In FIG. 1D, the cap layer 132, the conductive layers 130, 128, and the conductive layer 116 are patterned by photolithography and etching processes, which include forming a patterned photoresist layer (not shown) on the cap layer 132. The patterned photoresist layer has a pattern to form gate structures at the memory cell region 106, at the memory peripheral region 108, and at the logic circuit region 104 above the STI structure 110. An etching process is performed, using the patterned photoresist layer as an etching mask, a gate structure 138 is formed as the conductive layer 128 is etched to expose the dielectric layer 122. The gate structure 138 includes the conductive layers 128a, 130a, and the cap layer 132a. As the etching process is continuously performed, the conductive layer 116 under the dielectric layer 122 remains and formed a conductive layer 116a. However, a portion of the conductive layer 116 and the dielectric layer 114 are continuously etched to expose the substrate 100 at the memory array region 102. After etching, a gate structure 136 is formed over the substrate 100 at the memory peripheral region 108, where the gate structure 136 includes the conductive layer 116b, the conductive layers 128b, 130b, and the cap layer 132b. Similarly, the gate structure 134 is formed over the substrate 100 at the memory cell region 106, where the gate structure 134 includes the conductive layer 116c, the conductive layers 128c, 130c, and the cap layer 132c. During the etching process, the dielectric layer 122 serves as a etching mask to the conductive layer 116, so that the conductive layer 116a under the dielectric layer 122 remains, and can serve as a junction substrate for the thin film transistor formed subsequently. Then, the patterned photoresist layer is removed.

Figure 1E:
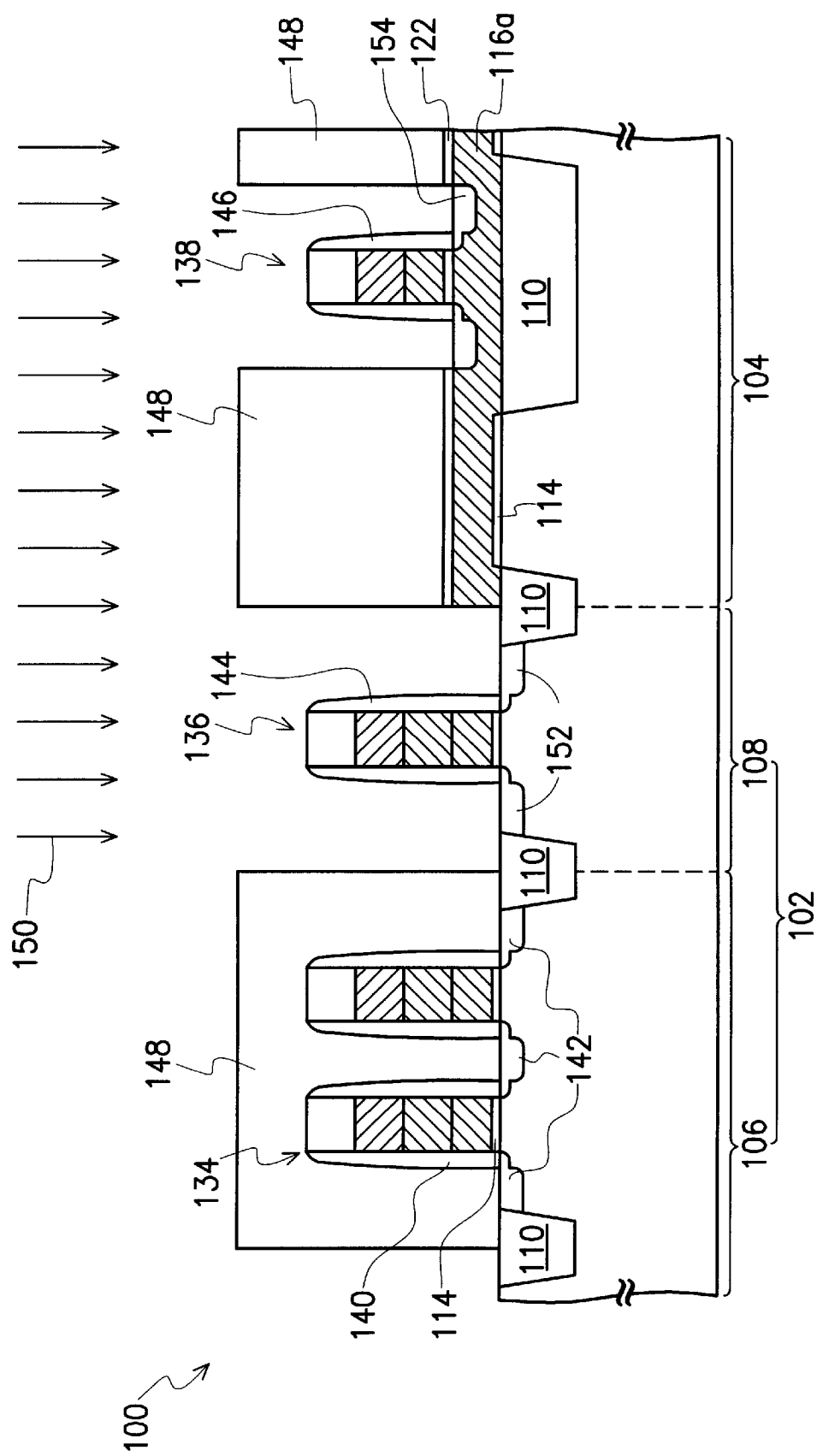

In FIG. 1E, a sidewall of the gate structure 134 at the memory cell region 106 is formed with a spacer 140, and a source/drain region 142 with lightly doped drain (LDD) structure is formed in the substrate at each side of the gate structure 134, so that the metal-oxide semiconductor (MOS) transistors at the memory cell region 106 is formed. After the MOS transistor at the memory cell region 106 is formed, a photoresist layer 148 is then formed over the substrate 100 to cover the MOS transistor at the memory cell region and the logic circuit region 104 other than the STI structure 110, where a thin film transistor is to be formed. In other words, the photoresist layer 148 exposes the memory peripheral region 108 and the a portion of the dielectric layer 122 around the gate structure 138, used for forming a thin film transistor later. The photoresist layer 148 is used as a mask to removed the expose portion of the dielectric layer 122 to expose the conductive layer 116a. Then, a light doped region is formed in the substrate at the memory peripheral region 108 and a lightly doped region is formed in the conductive layer 116a. A spacer 144 is formed at a sidewall of the gate structure 136, and a spacer 146 is formed at a sidewall of the gate structure 138. An implantation process 150 is performed, so as to form a source/drain region 152 in the substrate 100 at each side of the gate structure 136. Simultaneously, a source/drain region 154 is formed in the conductive layer 116a at each side of the gate structure 138, so that a thin film transistor is formed.

In the foregoing, the gate structures 134, 136, 138 at the memory cell region 106, the memory peripheral region 136, and the logic circuit region 104 above the STI structure 110 are patterned in the same patterning process. Also and, the source/drain regions 152 and 154 are also formed under the same implantation process. In this manner, the formation of the thin film transistor is compatible with the usual fabrication processes without need of an extra step with mask.

Figure 1F:
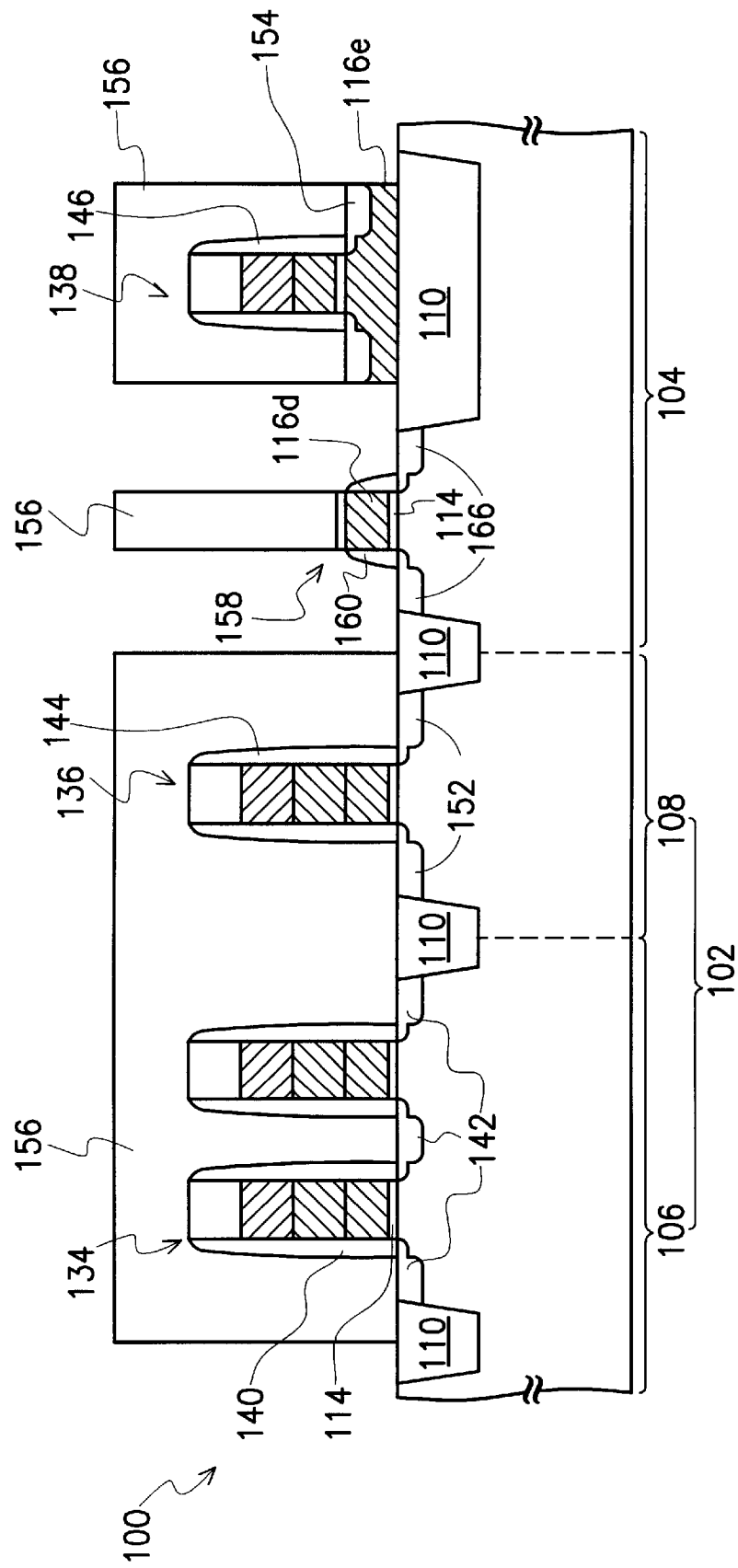

In FIG. 1F, the photoresist layer 148 is removed, and another photoresist layer 156 is formed to cover the memory array region 102, the thin film transistor above the STI structure 110, and a portion of the dielectric layer 122 where a gate structure is to be formed, such that a portion of the dielectric layer 122 at the logic circuit region 104 is exposed. The photoresist layer 156 is used as an etching mask, and then the dielectric layer 122, the conductive layer 116a and the dielectric layer 114 are patterned to formed a gate structure 156 at the logic circuit region 104. The conductive layer 116a is then divided into a conductive layer 116d under the gate structure 158, and a conductive layer 116e serving as a substrate for the thing film transistor. An LDD region, a spacer 160, and a source/drain region 166 are the formed at each side of the gate structure 158, so as to form a MOS transistor at the logic circuit region. The process to form the source/drain region with LDD structure is known in the prior art.

Figure 1G:
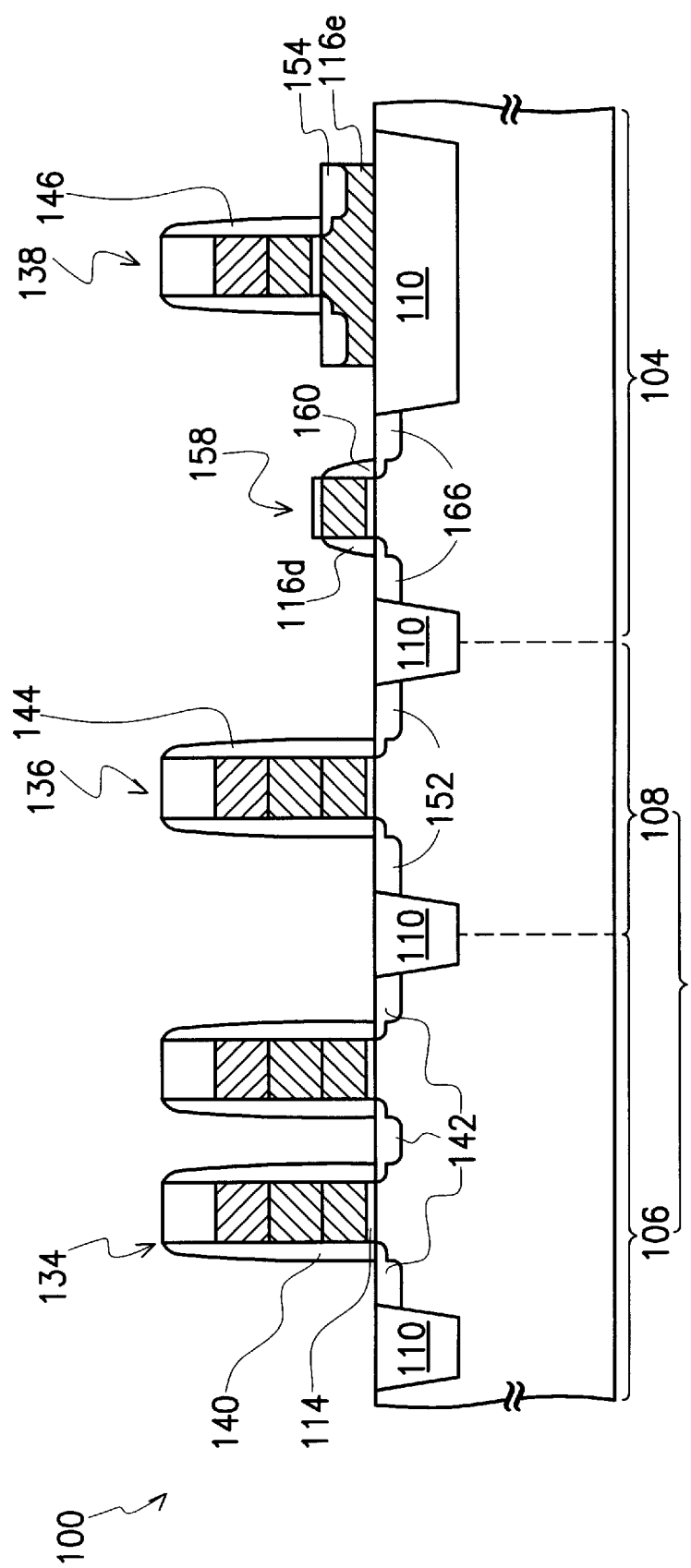

In FIG. 1G, the photoresist layer 156 is removed. As a result, the structure of a memory device with a thin film transistor is formed. In the structure of FIG. 1G, the thin film transistor above the STI structure 110 at the logic circuit region 104 is formed. As described above, formation of the thin film transistor is compatible with the typical fabrication process for forming the MOS transistors at the memory array region 102 and the logic circuit region 104. The thin film transistor formed above the STI structure 110 at the logic circuit region 104 can increase the integration but without consuming more substrate area. In general, the thin film transistor is not limited to be only formed above a STI structure at the logic circuit region, but instead the thin film transistor can be formed above any intended one of the STI structures 110 at the desired region.

Figure 1H:
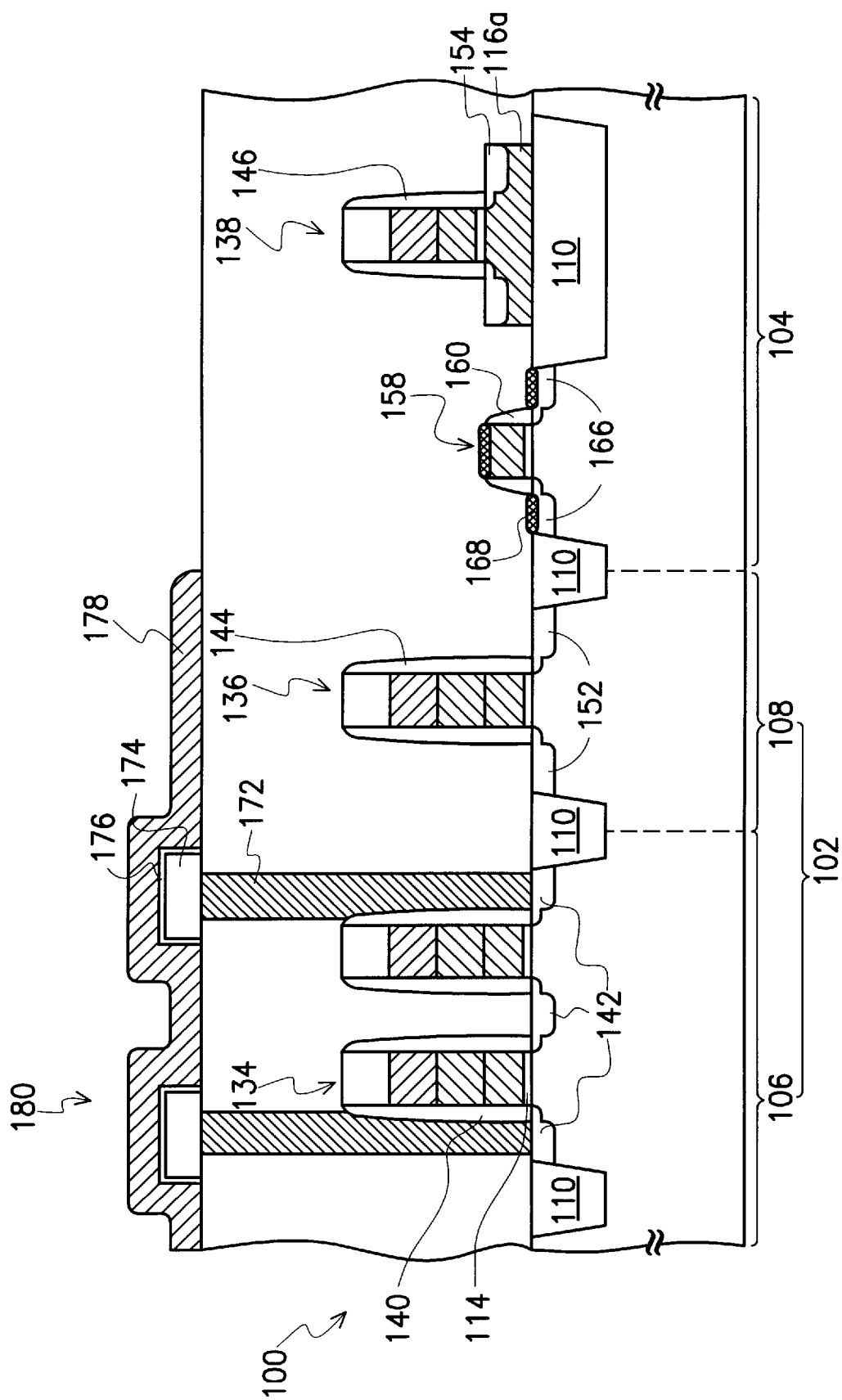

When the MOS transistors are formed, capacitors are necessary to be formed at the memory cell regions with respect to the MOS transistors 134. In FIG. 1H, in order to have better conductivity on the MOS transistor at the logic circuit region 104, a self-aligned silicide (salicide) layer 168 is formed on surfaces of the gate structure 158 and source/drain region 166 thereon. Then, capacitor 180 are formed with respect to the MOS transistors in the memory cell region 106. Formation of capacitors 180 is conventional. For example, a dielectric layer 170 is formed over the substrate 100. A contact plug 172 formed in the dielectric layer 170 with electrical contact to the corresponding source/drain region 142. A lower electrode 174 is formed on the dielectric layer 170 with electrical contact to the contact plug 172. A dielectric layer 176 is formed on the surface of the lower electrode 174. An upper electrode 178 of the capacitor 180 is formed over the lower electrode 174. The subsequent fabrication processes to complete the device are well known by skilled artisans, no further descriptions are provided here.

The invention particularly introduced a thin film transistor that is formed above a STI structure at any region in a memory device. Preferably, the thin film transistor is formed above the STI structure at the logic circuit region. However, the thin film transistor can also be formed in accordance with the formation of MOS transistor at the logic circuit region or any proper combination during fabrication processes.

Moreover, the STI structure can also be another type of isolation structure, such as a field oxide layer (FOX). Also and, the thin film transistor of the invention can also applied to any device with isolation structures.

In the integration, the thin film transistor is formed above the STI structure at the logic circuit region without causing extra masking step. The fabrication process is compatible with the process to form a DRAM device. Therefore, the wafer area can be utilized with better efficiency by forming more transistors. The integration is effectively improved and the device performance is effectively improved.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A method for fabricating a memory device with a thin film transistor, the method comprising:

providing a substrate, that has an array region, a logic circuit region, and a plurality of isolation structures, wherein the array region comprises a memory cell region and a memory peripheral region;

sequentially forming a first dielectric layer and a first conductive layer over the substrate;

performing an implantation process to dope and adjust threshold voltage on the first conductive layer at the logic circuit region;

forming a second dielectric layer over the first conductive layer at the logic circuit region;

doping the first conductive layer at the array region;

sequentially forming a second conductive layer, a third conductive layer, and a cap layer over the substrate;

patterning the cap layer, the third conductive layer, the second conductive layer, and the first conductive layer, whereby a plurality of gate structures at the memory cell region, a plurality of gate structures at the memory peripheral region, a thin film transistor (TFT) gate structure above the desired isolation structures at the logic circuit region are formed, wherein the second dielectric layer serves as a mask for removing an unmasked portion of the first conductive that results in a fourth conductive layer;

forming source/drain regions in the substrate with respect to the gate structures at the memory cell region;

forming source/drain regions in the substrate with respect to the gate structures at the memory peripheral region and a source/drain region in the fourth conductive layer with respect to the TFT gate structure;

patterning the fourth conductive layer to form a gate structure at the logic circuit region;

forming a source/drain region with respect to the gate structure at the logic circuit region; and forming a capacitor over the substrate at the memory cell region.

2. The method of claim 1, wherein the first conductive layer comprises undoped polysilicon.

3. The method of claim 1, wherein the second dielectric layer comprises one selected from the group consisting of silicon oxide, silicon nitride, oxide/nitride/oxide and dielectric with dielectric constant greater than oxide.

4. The method of claim 1, wherein the step of forming the source/drain regions in the substrate with respect to the gate structures at the memory peripheral region and the source/drain region in the fourth conductive layer with respect to the TFT gate structure comprises:

forming a lightly doped region in the substrate and in the second conductive layer with respect to the gate structures at the memory peripheral region and the TFT gate structure;

forming a spacer at a sidewall of the gates structures at the memory peripheral region and the TFT gate structure; and forming the source/drain regions in the substrate with respect to the gates structures at the memory peripheral region and the source/drain region with respect to the TFT gate structure.

5. The method of claim 1, wherein before the step of forming the capacitor, the method further comprises forming a salicide layer on the gate structure and the source/drain region at the logic circuit region.

6. The method of claim 1, wherein the second conductive layer and the cap layer has a different etching rate.

7. The method of claim 1, wherein the third conductive layer and the cap layer has a different etching rate.

8. A method for fabricating a memory device, comprising:

providing a substrate, having a plurality of isolation structures to separate the substrate into a plurality of device regions;

sequentially forming a thin film transistor (TFT) substrate layer and a dielectric layer over at least one of the isolation structures; and forming a MOS transistor at the device regions, wherein a TFT structure over the TFT substrate layer and the second dielectric layer is additionally formed.

9. The method of claim 8, wherein the TFT substrate layer comprises polysilicon.

* * * * *